(12) United States Patent
Takahashi (10) Patent No.: US 8,624,470 B2
(45) Date of Patent: Jan. 7, 2014

(54) PIEZOELECTRIC DEVICES INCLUDING ELECTRODE-LESS VIBRATING PORTIONS

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 332 days.

(21) Appl. No.: 13/052,560

(22) Filed: Mar. 21, 2011

(65) Prior Publication Data

US 2011/0234054 A1 Sep. 29, 2011

(30) Foreign Application Priority Data

Mar. 25, 2010 (JP) ................. 2010-069131

(51) Int. Cl.
*H01L 41/053* (2006.01)

(52) U.S. Cl.
USPC ........... 310/348; 310/344; 310/345; 310/349; 310/350

(58) Field of Classification Search
USPC ......................... 310/344, 345, 348, 349, 350
See application file for complete search history.

(56) References Cited

U.S. PATENT DOCUMENTS

| | | | |
|---|---|---|---|
| 3,339,091 A | | 8/1967 | Hammond et al. |
| 5,604,392 A | | 2/1997 | Vig |
| 6,794,799 B2 * | | 9/2004 | Takeshima et al. ........... 310/348 |
| 6,846,725 B2 * | | 1/2005 | Nagarajan et al. ............ 438/456 |
| 7,589,458 B2 * | | 9/2009 | Aratake ......................... 310/370 |
| 2007/0108874 A1 * | | 5/2007 | Okazaki et al. ................ 310/348 |
| 2009/0179524 A1 * | | 7/2009 | Saito ............................. 310/348 |
| 2011/0062825 A1 * | | 3/2011 | Kawahara ..................... 310/344 |

FOREIGN PATENT DOCUMENTS

| | | |
|---|---|---|
| JP | 54-084990 | 7/1979 |
| JP | H1-130547 | 5/1989 |
| JP | H02-113810 | 4/1990 |
| JP | H2-127038 U1 | 10/1990 |
| JP | H03-082924 U1 | 8/1991 |
| JP | H4-337668 | 11/1992 |
| JP | H07-130916 | 5/1995 |
| JP | H11-111959 | 4/1999 |
| JP | 2002-118440 | 4/2002 |
| JP | 2002-252544 | 9/2002 |
| JP | 2004-064013 | 2/2004 |
| JP | 2004-200631 | 7/2004 |

OTHER PUBLICATIONS

Translation of JP 2002-118440 provided as an attachment, Ishii Osamu.*
Besson et al., "Quartz Crystal Resonators and Oscillators, Recent Developments and Future Trends," *Ferroelectrics*, 43:57-65 (1982).

(Continued)

*Primary Examiner* — Derek Rosenau
*Assistant Examiner* — Bryan Gordon
(74) *Attorney, Agent, or Firm* — Klarquist Sparkman, LLP (57) ABSTRACT

An exemplary piezoelectric device has a piezoelectric vibrating board including a portion that exhibits thickness-shear vibration, and a frame portion extending around and supporting the vibrating portion. A first cover board, bonded to the first main surface of the frame portion, has a first excitation electrode. A second cover board, bonded to the second main surface of the frame portion, has a second excitation electrode. Thus, the vibrating portion is sealed in a package formed by the frame portion and cover boards. A first convexity, defined either on the bonded main surface of the first cover board or on the first main surface of the frame portion, surrounds the excitation electrode and establishes a predetermined gap between the vibrating portion and excitation electrode. The first cover board and frame portion are bonded by adhesive applied, adjacent the first convexity but not on the first convexity, continuously around the vibrating portion.

3 Claims, 10 Drawing Sheets

(56) References Cited

OTHER PUBLICATIONS

Office Action for related Japanese Patent Application No. 2010-069131, 2 pages, Aug. 6, 2012 (in Japanese).
Office Action for related Japanese Patent Application No. 2010-069131, 3 pages, May 9, 2012 (in Japanese).
Office Action for related Japanese Patent Application No. 2010-069131, 2 pages, Feb. 6, 2012 (in Japanese).

* cited by examiner

PIEZOELECTRIC DEVICES INCLUDING ELECTRODE-LESS VIBRATING PORTIONS

CROSS-REFERENCE TO RELATED APPLICATION

This application claims priority to and the benefit of Japan Patent Application No. 2010-069131, filed on Mar. 25, 2010 in the Japan Patent Office, the disclosure of which is incorporated herein by reference in its entirety.

FIELD

This disclosure pertains to, inter alia, surface-mount type piezoelectric devices.

DESCRIPTION OF THE RELATED ART

One conventional type of "piezoelectric device" includes a "board" (substrate) of AT-cut quartz crystal enclosed in a "package." The crystal board has upper and lower main surfaces on which respective excitation electrodes have been formed. When electrically excited via the excitation electrodes, the AT-cut crystal exhibits "thickness shear" vibration. The fundamental resonance frequency at which the AT-cut crystal substrate vibrates is a function of substrate thickness (between the upper and lower main surfaces), wherein the frequency varies inversely with substrate thickness.

Excitation electrodes formed directly on the main surfaces of the crystal board can adversely affect its vibration. One reason is that excitation electrodes add mass to the vibrating portion of the crystal substrate. Even a crystal substrate configured to vibrate at a fundamental frequency of 300 MHz or higher can exhibit vibrational interference caused by the presence of excitation electrodes formed directly on the main surfaces of the crystal substrate.

One conventional way in which to solve this problem is to excite the crystal board using "space electrodes." A space electrode is an excitation electrode that is separated from the respective main surface of the piezoelectric substrate by a defined narrow gap. Electrical energy necessary to induce vibration is supplied from the respective space electrodes across the respective gaps to the respective main surfaces of the crystal board.

Spatially separating the excitation electrodes from respective surfaces of the crystal vibrating board is discussed in Japan Unexamined Patent Application No. 2002-118440. In an exemplary piezoelectric device according to this reference, a piezoelectric board or substrate (called an "electrode-less" substrate) is sandwiched between two additional piezoelectric boards (each called an "electroded" substrate), but with defined gaps between the electrode-less substrate and each of the electroded substrates. Each electroded substrate comprises a respective space electrode that faces the respective main surface of the electrode-less substrate across the respective gap. To induce vibration of the electrode-less substrate, a suitable electrical waveform is applied to the space electrodes on the electroded substrates. The electrode-less substrate is excited to vibrate by induction of the electrical waveform from the energized space electrodes to the electrode-less substrate. Actual vibration in the electrode-less substrate occurs mainly in a central region thereof, which usually has a "mesa" configuration in which the central region is thicker than regions of the substrate surrounding the central region.

In the package, the electrode-less substrate is bonded to the electroded substrates using an electrically conductive adhesive applied in respective peripheral recesses in the bondable main surfaces of each substrate. This bonding step also establishes certain electrical connections to the electrodes. In this particular bonding scheme, thicker portions of the substrates (located inboard of the recesses) contact each other but are not bonded together. Consequently, the devices are susceptible to air leaks from outside to inside the package. These leaks can cause the device to exhibit excessive temporal drift of vibration parameters.

Further regarding the devices disclosed in JP '440, the space electrodes are connected to respective mounting-board terminals on the package using electrically conductive adhesive raised from the terminals up the sides of the device. This technique cannot be performed using common solder paste or conventional mounting steps; rather, a special procedure is required. Furthermore, to ensure formation of good electrical interconnections using the adhesive, the adhesive must be applied with a constant width and at a highly accurate dispensing rate to allow the width of each piezoelectric device thus formed to be minimized as much as possible.

SUMMARY

The problems with conventional devices and methods summarized above are addressed by various aspects of the invention disclosed herein. The aspects are directed to, inter alia, piezoelectric devices that have a predetermined gap between the piezoelectric vibrating substrate and its respective excitation "space" electrodes, while also providing reliable hermetic sealing of the piezoelectric device thus formed.

A first aspect of the invention is directed to piezoelectric devices. Each piezoelectric "device" comprises a piezoelectric vibrating board enclosed in a "package." The package is defined, at least in part, by the piezoelectric vibrating board, an upper "cover board," and a lower "cover board," wherein the vibrating board is sandwiched between the cover boards. In most, but not all, embodiments the vibrating board is electrode-less and each of the cover boards is electroded to provide respective "space electrodes" serving as excitation electrodes for the vibrating board and separated from the vibrating board by respective gaps. Thus, the vibrating board is induced to vibrate by electrically energizing the space electrodes.

A first embodiment of a piezoelectric device comprises a piezoelectric vibrating substrate including a vibrating portion that exhibits a thickness-shear vibration mode when appropriately energized. The device also includes a frame portion that extends around and supports the vibrating portion. A first cover board, bonded to an upper main surface of the frame portion, includes a respective excitation electrode capable of exciting the vibrating portion across a gap. The excitation electrode is aligned with the vibrating portion and with a region peripheral to the vibrating portion. A second cover board, bonded to a lower main surface of the frame portion, includes a respective excitation electrode capable of exciting the vibrating portion across a gap. The excitation electrode of the second cover board is also aligned with the vibrating portion and with a region peripheral to the vibrating portion. The first and second cover boards sandwich the piezoelectric vibrating substrate therebetween. The frame portion, first cover board, and second cover board collectively form the package in which the vibrating portion is supported and sealed from the external environment. The excitation electrodes are connected to respective external electrodes situated outside the package, such as on the outer main surface of one of the cover boards, or on outer main surfaces of respective cover boards. A first convexity is defined on the upper main surface of the frame portion and/or on a peripheral region of the inner main surface of the first cover board. The first convexity surrounds the excitation electrode formed on the inner main surface of the first cover board to maintain a predetermined gap between the piezoelectric vibrating substrate and the excitation electrode. The first cover board and piezoelectric vibrating substrate are bonded together using an adhesive applied as a continuous bead inboard of the first convexity (but not on the first convexity) so as to surround the vibrating portion. Alternatively, the adhesive can be applied outboard of the first convexity.

The first cover board can further comprise a second convexity, situated outboard of the first convexity. The second convexity desirably has the same height as the first convexity. The second convexity can be defined on the main surface of the frame portion facing the first cover board or on the inner main surface of the first cover board, or on both main surfaces. In these configurations involving two convexities, the adhesive is located between the first and second convexities.

The second cover board has a respective space electrode (excitation electrode) that, in concert with the space electrode on the first cover board, excites the vibrating portion to vibrate. The space electrode of the second cover board is aligned with the vibrating portion and with regions of the piezoelectric vibrating substrate surrounding the vibrating portion. A third convexity can be defined on either the inner main surface of the second cover board or on the lower main surface of the frame portion. The third convexity substantially extends circumferentially around the excitation electrode, and the height of the third convexity establishes the gap between the excitation electrode and the vibrating portion. The second cover board is bonded to the frame portion using an adhesive, of which a continuous bead is applied just inboard of the third convexity so as to extend completely around the vibrating portion.

Certain embodiments of the subject piezoelectric devices further comprise a fourth convexity, situated outboard of the third convexity but having the same height as the third convexity. The fourth convexity is situated on either the lower main surface of the frame portion of the piezoelectric vibrating board or the upper main surface of the second cover board. In either event, the adhesive is applied as a continuous bead between the third convexity and the fourth convexity.

Various embodiments of piezoelectric devices described herein establish a predetermined gap between the piezoelectric vibrating board and each of its excitation "space" electrodes. The embodiments also provide effective hermetic sealing of the packages of the piezoelectric devices using adhesive applied adjacent convexity(ies) surrounding respective excitation electrodes.

The subject devices are easier than conventional devices to surface-mount because the subject devices provide one or two external electrodes on the outer surface of a respective cover board.

DETAILED DESCRIPTION

Various embodiments are described below with reference to the figures. It will be understood that the scope of the invention is not limited to the described embodiments.

First Embodiment of Piezoelectric Vibrating Device

FIGS. 1A-1D are respective schematic views of this embodiment 100 of a piezoelectric vibrating device 100. The device 100 comprises an electrode-less piezoelectric substrate having first and second main surfaces, and two electroded substrates each having a respective main surface on which a respective space electrode has been formed. Each space electrode is separated from the respective main surface of the electrode-less substrate by a respective gap. Each electroded substrate is actually a respective cover board, thereby providing an upper and a lower cover board. The electrode-less piezoelectric substrate is induced to vibrate by electrical potentials being applied thereto across the gaps from the space electrodes.

Figure 1A:
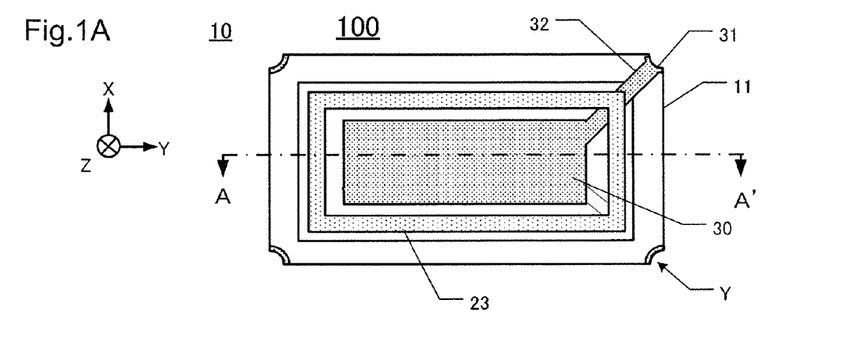
FIG. 1A is a plan view of a first cover board, as viewed from a corresponding piezoelectric vibrating substrate, of a first embodiment of a piezoelectric vibrating device.
Figure 1B:
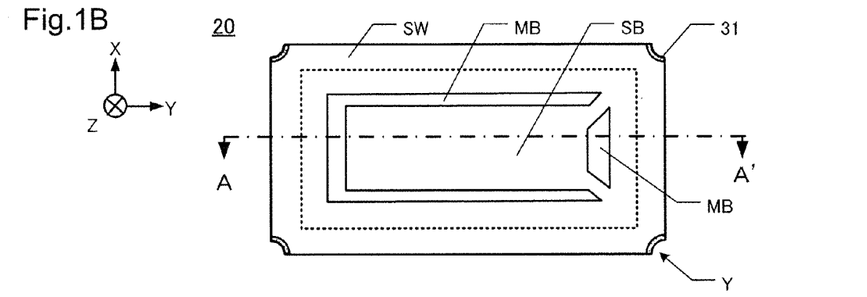
FIG. 1B is a plan view of a piezoelectric vibrating substrate of the first embodiment.
Figure 1C:
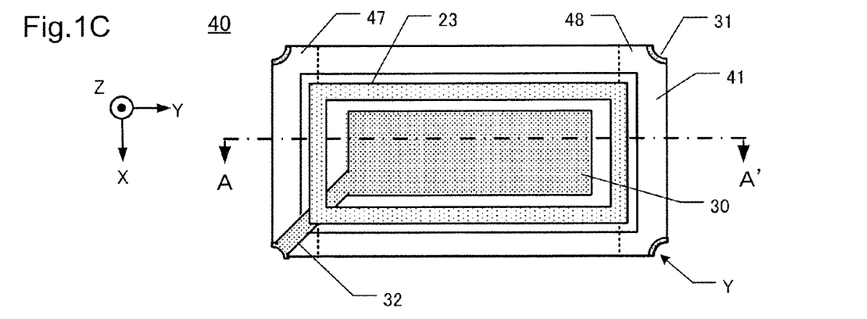
FIG. 1C is a plan view of a second cover board of the first embodiment.
Figure 1D:
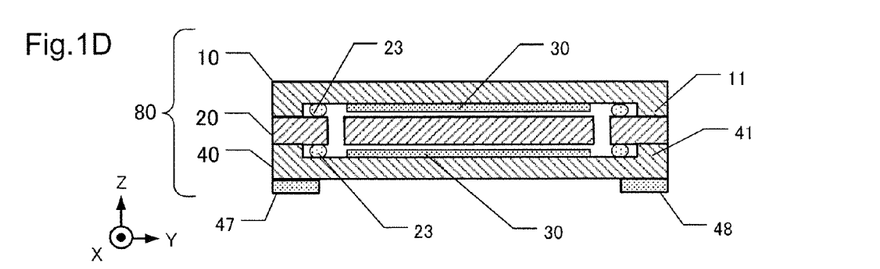
FIG. 1D is a cross-sectional view of the first embodiment of a piezoelectric device along the line A-A' in FIGS. 1A, 1B, and 1C.

FIG. 1A is a plan view of the first (upper) cover board 10 of this embodiment, as viewed from the electrode-less piezoelectric substrate 20. FIG. 1B is a plan view of the electrode-less piezoelectric substrate 20. FIG. 1C is a plan view of the second (lower) cover board 40. FIG. 1D is a cross-sectional view of this embodiment 100 along the line A-A' in FIGS. 1A, 1B, and 1C. Thus, this piezoelectric vibrating device 100 comprises an electrode-less piezoelectric vibrating board 20, a first cover board 10, and a second cover board 40, collectively forming a package 80. The first and second cover boards 10, 40 desirably are made of glass, ceramics, or a crystal material. As referred to herein, the longitudinal direction of the piezoelectric device 100 is in the Y-axis direction, the width direction of the piezoelectric device is in the X-axis direction, and the thickness direction is in the Z-axis direction.

As shown in FIG. 1A, the first cover board 10 has a peripheral convexity 11 surrounding a middle region. In the package 80 the middle region and peripheral convexity face the piezoelectric vibrating board 20. The convexity 11 is formed by etching away material of the first cover board 10 corresponding to the middle region, inboard of the convexity 11. In the middle region is an excitation electrode 30. A respective extraction electrode 32 extends from one corner of the excitation electrode 30 to a respective corner of the first cover board 10, on the convexity. The excitation electrode 30 and the extraction electrode 32 each comprise a gold (Au) layer of 400 Å to 2000 Å thickness formed on a chromium (Cr) layer of 150 Å to 700 Å thickness. In the middle region, just inboard of the convexity, is a continuous bead of electrically conductive adhesive 23 that thus surrounds the excitation electrode 330. A respective notch Y is located at each of the four corners of the first cover board 10, in which conduction wiring is formed. The conduction wiring 31 is electrically connected to the extraction electrode 32.

In FIG. 1B the piezoelectric vibrating board 20 is made of an AT-cut crystal vibrating piece. A respective notch Y is formed at each of the four corners of the piezoelectric vibrating board 20, in which conduction wiring 31 is formed. The piezoelectric vibrating board 20 includes a vibrating portion SB that exhibits, when energized, a thickness-shear vibration mode. The vibrating portion SB is located in the middle of the piezoelectric vibrating board 20. The piezoelectric vibrating board 20 also includes a supporting-frame portion SW extending circumferentially around the vibrating portion SB. The vibrating portion SB and the supporting-frame portion SW desirably are defined by through-hole grooves MB that fully penetrate the thickness dimension of the piezoelectric vibrating board 20. Note that the through-hole grooves MB may not be required.

Turning now to FIG. 1C, the second cover board 40 has a peripheral convexity 41 surrounding a middle region. In the package 80 the middle region and peripheral convexity 41 face the piezoelectric vibrating board 20. The convexity 41 is formed by etching away material of the second cover board 40 corresponding to the middle region, inboard of the convexity. In the middle region is an excitation electrode 30. A respective extraction electrode 32 extends from one corner of the excitation electrode 30 to a respective corner of the second cover board 40, on the convexity. The excitation electrode 30 and the extraction electrode 32 each comprise a gold (Au) layer of 400 Å to 2000 Å thickness formed on a chromium (Cr) layer of 150 Å to 700 Å thickness. In the middle region, just inboard of the convexity 41, is a continuous bead of electrically conductive adhesive 23 that thus surrounds the excitation electrode 330. A respective notch Y is located at each of the four corners of the first cover board 10, in which conduction wiring is formed. The conduction wiring 31 is electrically connected to the extraction electrode 32.

First and second external electrodes 47, 48, respectively, are formed on the lower main surface of the second cover board 40. Both external electrodes 47, 48 are metallized. The external electrodes 47, 48 are electrically connected to respective conduction wiring 31 in a respective notch Y.

As shown in FIG. 1D, the piezoelectric device 100 is formed by sandwiching the piezoelectric vibrating board 20 between the first cover board 10 as a package top and the second cover board 40 as a package bottom, and bonding all three boards together. On the first and second cover boards 10, 40, the respective bead of electrically conductive adhesive 23 is applied inboard of the respective convexities 11, 41 so as to surround all inboard structure. The top of each bead of adhesive 23 as applied is higher (in the Z-direction) than the respective convexity 11, 41 (see FIG. 4B). Thus, the adhesive 23 flattens and spreads out somewhat with application of pressure during assembly of the package. The adhesive 23 is cured by heating (thermally hardened) during assembly and bonding together of the frame portion SW, first cover board 10, and second cover board 40 to form the package 80. Meanwhile, the excitation electrodes 30 are hermetically sealed inside the package 80 by the adhesive 23. The resulting hermetic isolation of the excitation electrodes 30 from the external environment provides a device 100 that is very stable over time.

Figure 2A:
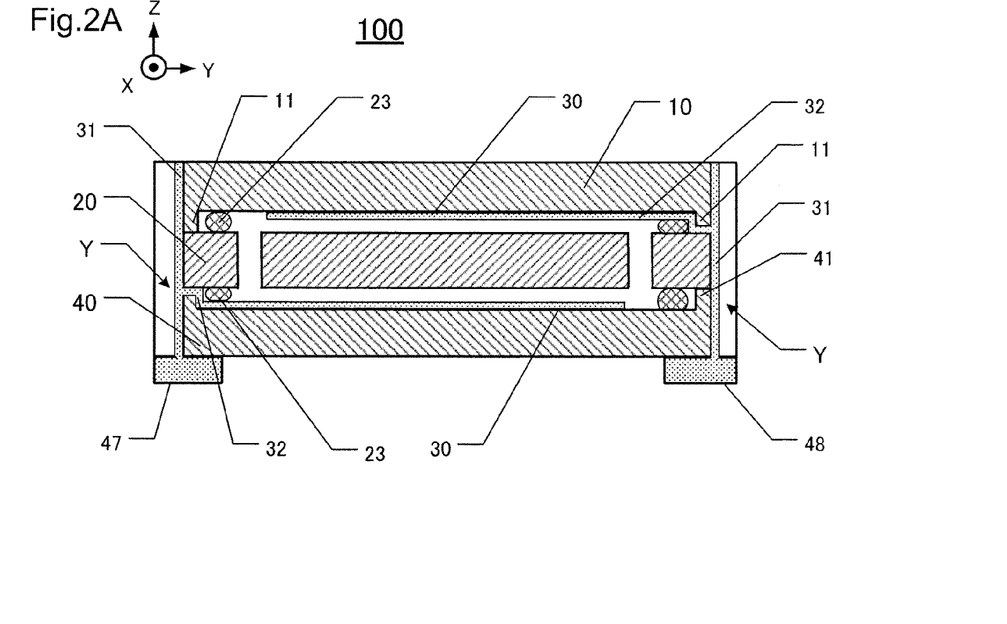
FIG. 2A is a cross-sectional view, along the line B-B' in FIG. 2B, of the first embodiment.
Figure 2B:
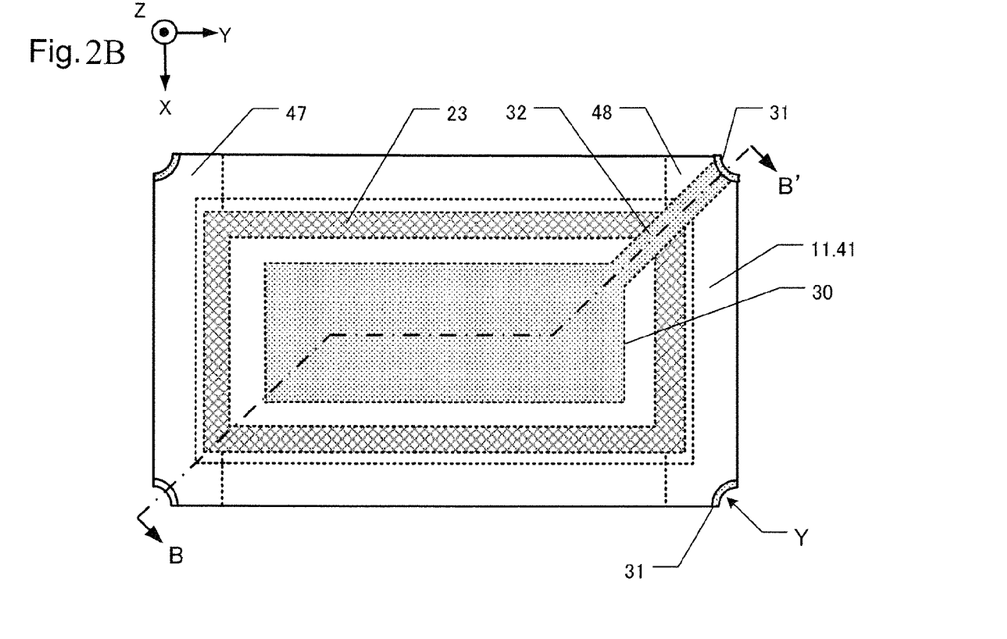
FIG. 2B is a plan view of the first embodiment of a piezoelectric vibrating device.

FIG. 2A is an enlarged cross-sectional view of the piezoelectric device 100 along the line B-B' in FIG. 2B. FIG. 2B is a plan view of the piezoelectric device 100. These two figures show the excitation electrodes 30, the extraction electrodes 32, the convexities 11, 41, the adhesive 23, and the external electrodes 47, 48. The adhesive 23 is denoted by cross-hatching to distinguish it more clearly from the convexities 11, 41, the excitation electrode 30, and the extraction electrode 32. In FIG. 2A the first external electrode 47 is electrically connected to conductive wiring 31 in a respective notch Y and also to the excitation electrode 30 and extraction electrode 32 on the second cover board 40. Similarly, the second external electrode 48 is electrically connected to conductive wiring 31 in a respective notch Y and also to the excitation electrode 30 and extraction electrode 32 on the first cover board 10.

FIG. 2B also shows that the excitation electrode 30 on the first cover board 10 faces the excitation electrode 32 on the second cover board 40. These excitation electrodes are vertically aligned with each other while the extraction electrodes 32 are diagonally opposed to each other (in the XY plane).

First Embodiment of Method for Manufacturing Piezoelectric Device

Multiple second cover boards 40 are typically made simultaneously by forming many of them on a single wafer, called a "second cover wafer 40W." Similarly, multiple first cover boards 10 are typically made simultaneously by forming many of them on a single wafer, called a "first cover wafer 10W." Also, similarly, multiple piezoelectric vibrating boards 20 are made simultaneously by forming many of them on a single wafer, called a "crystal wafer" 20W.

Figure 3A:
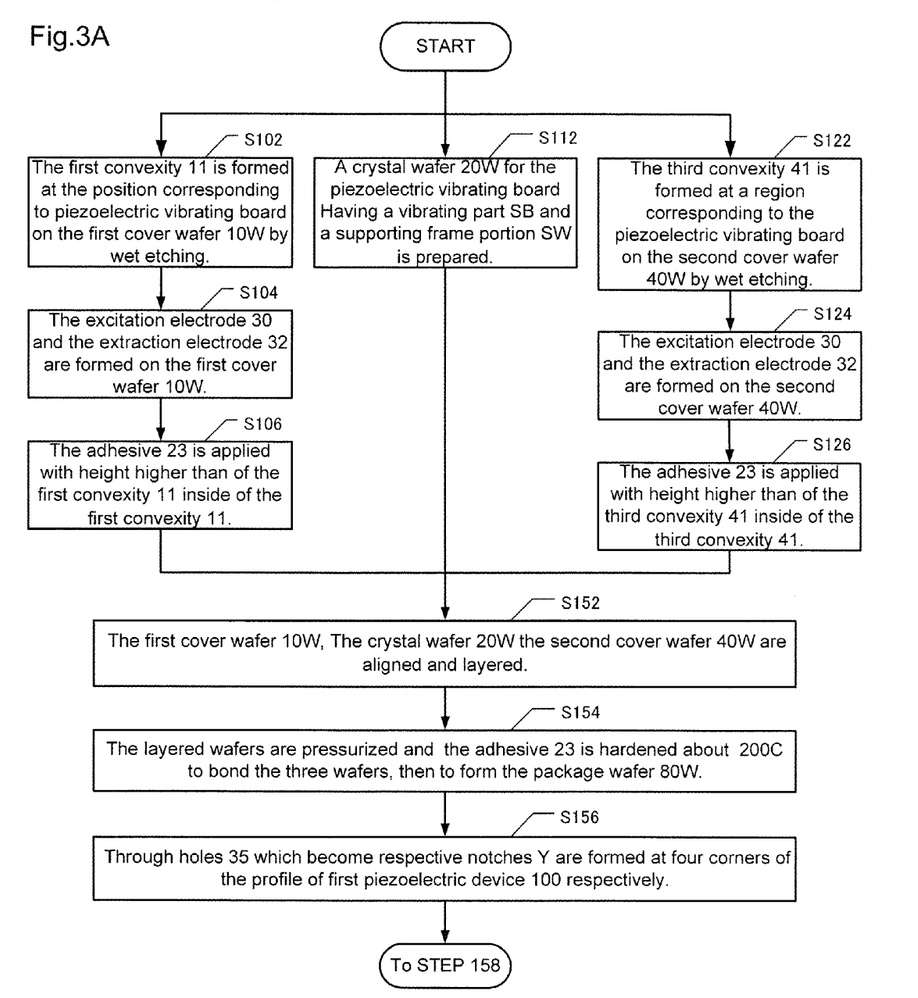
FIG. 3A is a flow-chart of a first portion of an embodiment of a method for manufacturing the package of the first embodiment of a piezoelectric vibrating device.
Figure 3B:
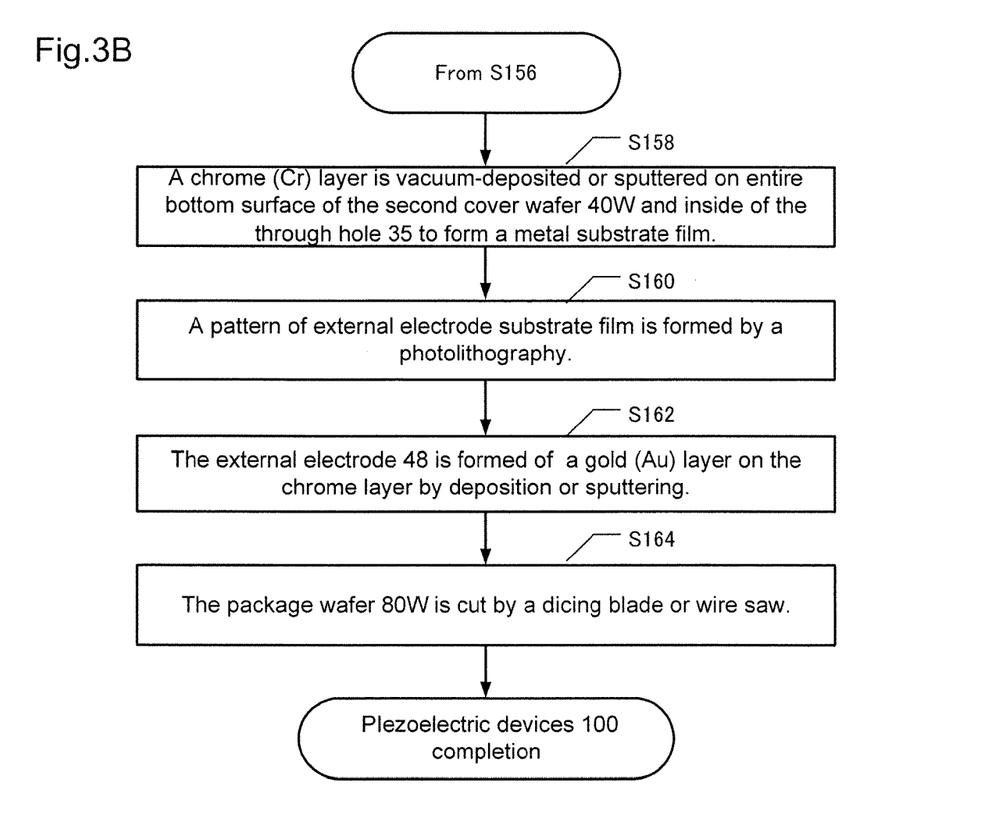
FIG. 3B is a flow-chart of a second portion of an embodiment of a method for manufacturing the first embodiment of a piezoelectric vibrating device, including cutting up a wafer on which multiple packages have been are formed.

FIGS. 3A and 3B are flow-charts of respective portions of this embodiment of a method for manufacturing the piezoelectric device 100. The depicted steps can be performed to manufacture the devices one at a time or to manufacture multiple devices (hundreds to thousands) simultaneously by conducting the process steps on wafers containing multiple individual components.

In step S102 a convexity 11 is formed in a region (XY plane) of a first cover wafer 10W. The outside edge of the convexity 11 corresponds to the outline profile of the piezoelectric device 100, and this step is performed by wet-etching.

In step S104 the excitation electrode 30 and the extraction electrode 32 are formed on the first cover wafer 10W. Each excitation electrode 30 and extraction electrode 32 is, for example, a gold (Au) layer (400 Å to 2000 Å thickness) formed on a layer of chromium (Cr) (150 Å to 700 Å thickness). Instead of the chromium (Cr) layer, a titanium (Ti) layer can be used, and a silver (Ag) layer can be used instead of the gold (Au) layer.

In step S106 the adhesive 23 is applied as a continuous bead in a region (XY plane) just inboard of the convexity 11 but higher (in the Z-direction) than the height of the convexity 11. The adhesive 23 desirably is applied by a printing technique. The convexity 11 surrounds the bead of adhesive 23.

In step S112 a crystal wafer 20W is prepared, on which multiple piezoelectric vibrating boards 20 are to be fabricated. Each vibrating board 20 includes a respective vibrating portion SB and a respective supporting-frame portion SW surrounding the vibrating portion SB.

In step S122 a convexity 41 is formed in a region (XY plane) of a second cover wafer 40W. The outside edge of the convexity 41 corresponds to the outline profile of piezoelectric device 100, and this step is performed by wet-etching.

In step S124 the excitation electrode 30 and extraction electrode 32 are formed on the second cover wafer 40W. Each excitation electrode 30 and extraction electrode 32 is, for example, a gold (Au) layer (400 Å to 2000 Å thickness) formed on a layer of chromium (Cr) (150 Å to 700 Å thickness). Instead of the chromium (Cr) layer, a titanium (Ti) layer can be used, and a silver (Ag) layer can be used instead of the gold (Au) layer.

In step S126 the adhesive 23 is applied as a continuous bead in a region (XY plane) just inboard of the convexity 41 but higher (in the Z-direction) than the height of the convexity 41. The adhesive 23 desirably is applied by a printing technique. The convexity 41 surrounds the bead of adhesive 23.

Figure 4A:
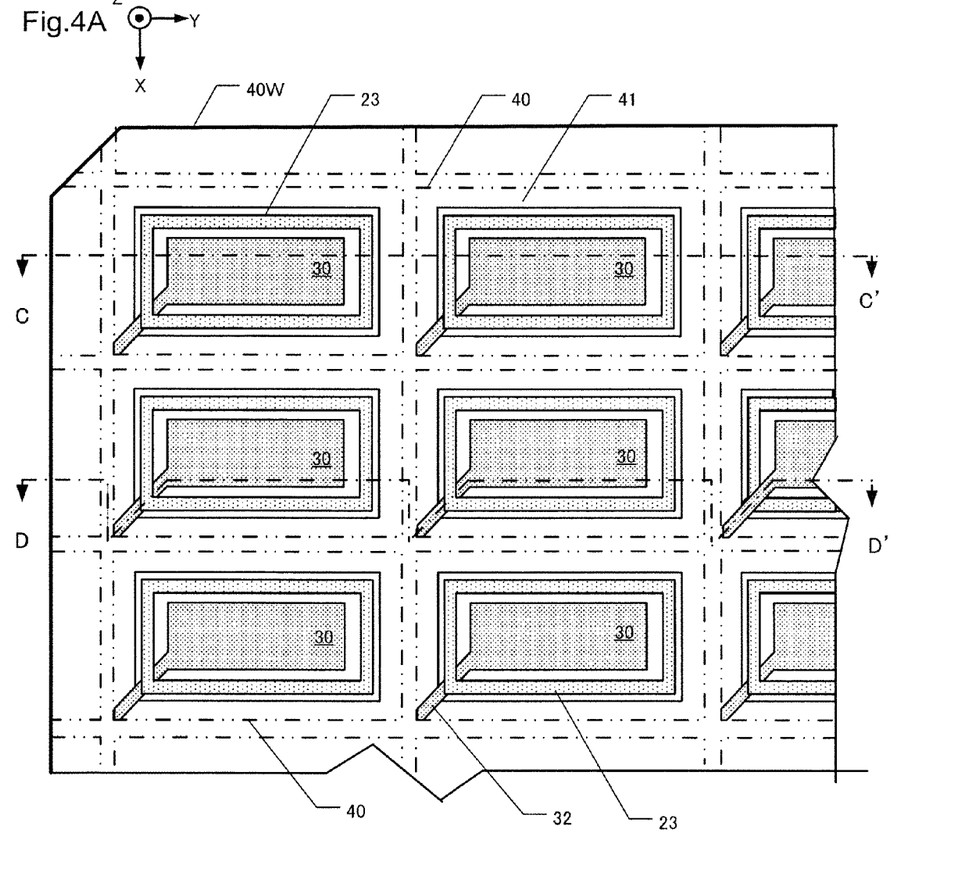
FIG. 4A is a plan view of a wafer containing multiple cover boards.
Figure 4B:
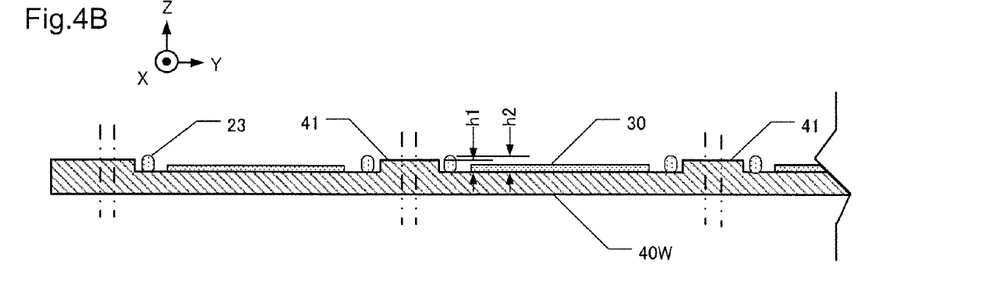
FIG. 4B is a cross-sectional view along the line C-C' in FIG. 4A.

FIG. 4A is a plan view of the second cover wafer 40W, and FIG. 4B is a cross-sectional view along the line C-C' in FIG. 4A. In FIG. 4A virtual lines (two-dot lines) denote the edge profiles of respective second cover boards 40, for clarity. The height h2 (Z-direction) of the bead of adhesive 23 is greater than the height h1 of the convexity 41. The bead of adhesive 23 has high viscosity, which tends to round out its cross-section by surface tension. During package assembly, when the piezoelectric vibrating wafer 20W is sandwiched between the first and second cover boards (see FIG. 5) and compression (in the −Z-direction) is applied, the adhesive 23 is squashed and flattened.

Continuing further with FIG. 3A, in step S152 the crystal wafer 20W containing the piezoelectric vibrating boards is sandwiched between the first cover wafer 10W and the second cover wafer 40W. In the sandwich, the first cover wafer 10W is the upper wafer and the second cover wafer 40W is the lower wafer.

In step S154 the three-layer sandwich is compressed under a vacuum or in an inert-gas atmosphere. Under these conditions the adhesive 23 cures at relatively low temperature (100° C. to 200° C., to bond the three wafers together to form the package wafer 80W.

Figure 5A:
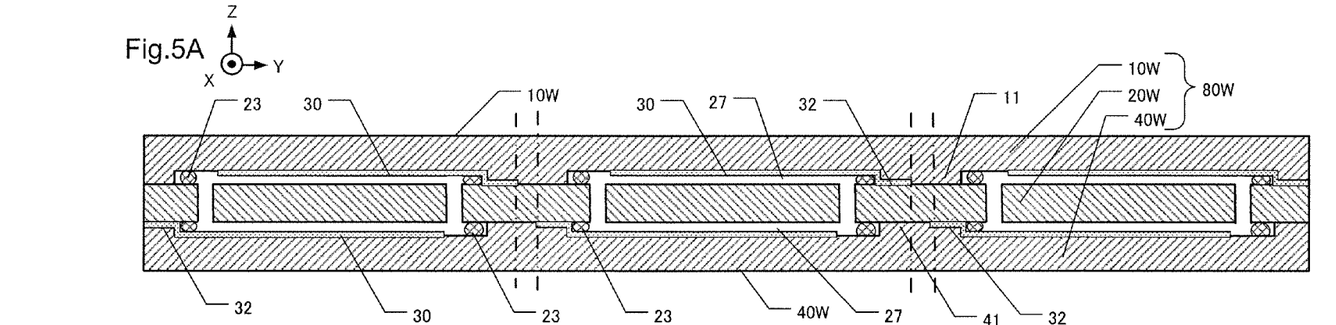
FIG. 5A is a cross-sectional view of the first embodiment of a piezoelectric vibrating device, along the line D-D' in FIG. 4A.

FIG. 5A is a cross-sectional view of multiple piezoelectric devices 100, along the line D-D' in FIG. 4A. For clarity, virtual lines (two-dot lines) denote the edges of corresponding piezoelectric devices 100. Note that, in the depicted sandwich, the first cover wafer 10W, the crystal wafer 20W, and the second cover wafer 40W are aligned with each other. The wafers are bonded together by the adhesive 23. This bonding is performed, with application of heat and compression, under a vacuum or in an inert-gas atmosphere to cure (harden) the adhesive 23 and form the packages 80W. Inside the cavity 27 is a vacuum or inert-gas atmosphere. The adhesive 23 is applied having a height (in the Z-direction) greater than the height of either convexity 11, 41. During subsequent bonding together of the three-layer sandwich, the adhesive 23 is squashed. Nevertheless, the respective heights of the convexities 11 and 41 are maintained so that desired respective gaps are established and maintained between the piezoelectric vibrating board 20 and the excitation electrodes 30.

Figure 5B:
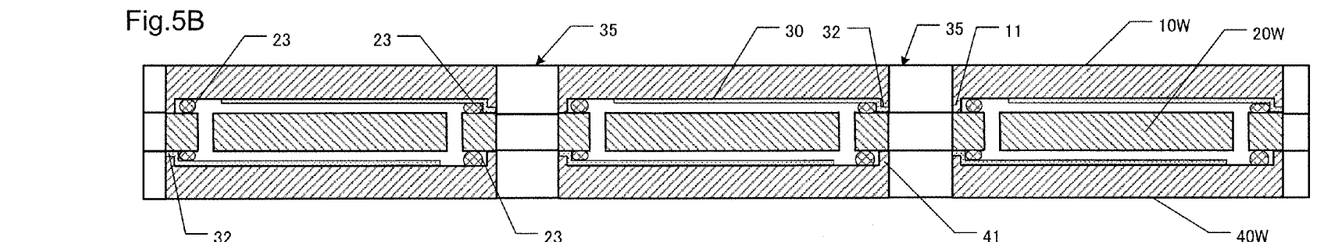
FIG. 5B is a cross-sectional view showing the formation of through-holes in the wafer shown in FIG. 5A.

Returning again to FIG. 3A, in step S156 a respective through-hole 35 is formed at each of the four corners of the edge-profile (XY plane) of the piezoelectric device 100. These through-holes 35 are destined to form the corner notches Y. FIG. 5B is a cross-sectional view showing the formation of the through-holes 35. Note that an edge of each extraction electrode 32 is denuded by formation of the through-holes 35.

In step S158 of FIG. 3B, a chromium (Cr) layer is formed (e.g., by sputtering) on the entire lower main surface of the second cover wafer 40W and inside the through-holes 35 to form a metal substrate film.

In step S160 a film of resist is applied and patterned by photolithography according to positions and configurations of external electrodes. Steps S160 and S158 can be performed simultaneously.

In step S162 the metal film 31 and external electrodes 47, 48 are formed by forming a gold (Au) layer on a chromium (Cr) layer by deposition, sputtering, or wet electroplating.

In step S164 the package wafer 80W on which the external electrodes are formed (see FIG. 5) is cut by a dicing blade, wire saw, or laser beam along the outline profile (on the XY-plane) of the piezoelectric device 100 to form individual piezoelectric devices 100 detached from the package wafer 80. The excitation electrodes 30 are connected to the respective external electrodes via the respective extraction electrodes 32 and metal film 31.

Figure 5C:
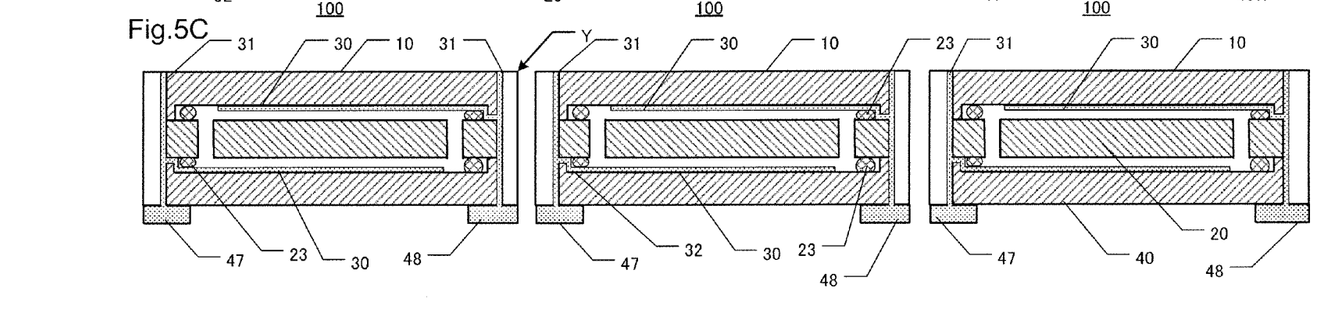
FIG. 5C is a cross-sectional view showing cutting of the wafer of FIG. 5B using a dicing saw, wherein cutting is performed after forming respective metal films inside the through-holes and forming corresponding external electrodes on the second cover board.

FIG. 5C is a cross-sectional view showing the results of cutting the package wafer 80, using a dicing saw, to form multiple piezoelectric devices 100. The cuts are made after forming a metal film inside each through hole 35 and forming the external electrodes on the second cover board. In the devices shown in FIG. 5C, a chromium (Cr) layer is sputtered on the entire lower main surface of the second cover board 40W and inside the through-holes 35 to form a metal substrate film. The external electrodes 47, 48 comprise a gold (Au) layer on a chromium (Cr) layer, as formed by deposition, sputtering, or wet electroplating.

Second Embodiment of Piezoelectric Device

Figure 6A:
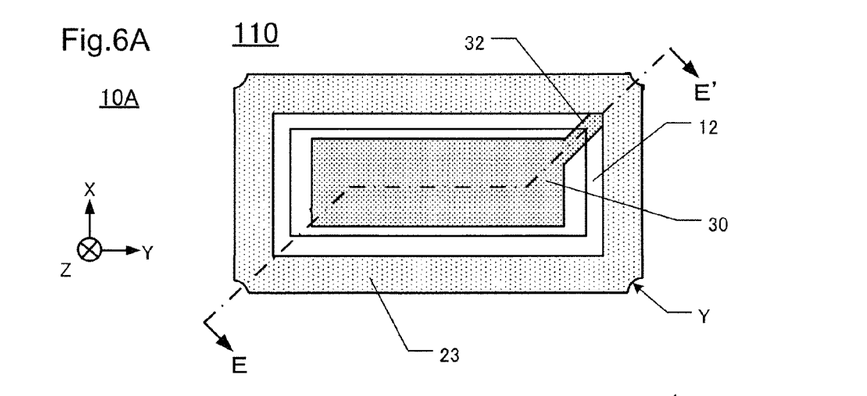
FIG. 6A is a plan view of a first cover board, as viewed from the piezoelectric vibrating substrate, of a second embodiment of a piezoelectric vibrating device.
Figure 6B:
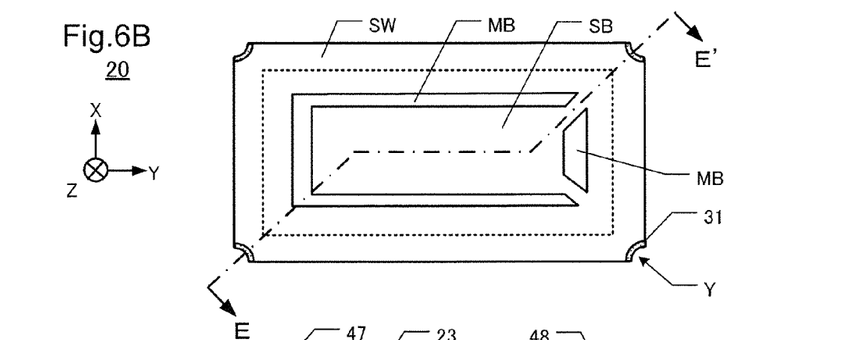
FIG. 6B is a plan view of the piezoelectric vibrating substrate of the second embodiment.
Figure 6C:
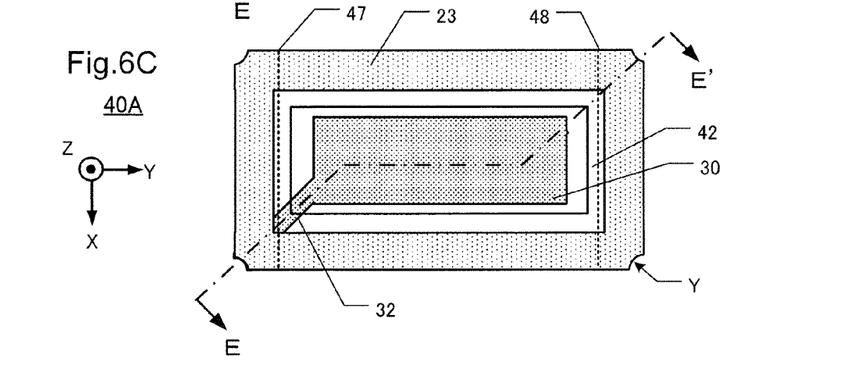
FIG. 6C is a plan view of the second cover board of the second embodiment.
Figure 6D:
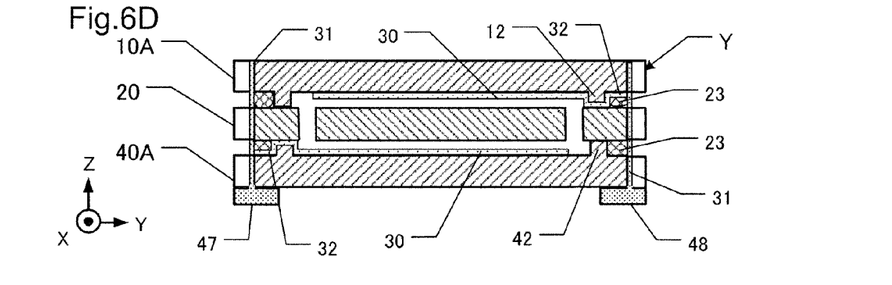
FIG. 6D is a cross-sectional view of the second embodiment of a piezoelectric device, along the line E-E' in FIGS. 6A, 6B, and 6C.

FIGS. 6A-6D are schematic views of this embodiment of a piezoelectric device 110 provided with space electrodes and operable by space-voltage impression (induction) to cause vibrations in the piezoelectric vibrating board. FIG. 6A is a plan view of a first cover board 10A as viewed from the piezoelectric vibrating board. FIG. 6B is a plan view of the piezoelectric vibrating board 20 used in this embodiment. FIG. 6C is a plan view of a second cover board 40A as viewed from the piezoelectric vibrating board. FIG. 6D is a cross-sectional view of the piezoelectric device 110 along the line E-E' in each of FIGS. 6A, 6B, and 6C. Thus, this second embodiment of a piezoelectric device 110 comprises one piezoelectric vibrating board 20, a first cover board 10A, and a second cover board 40A. The cover boards 10A, 40A are made of glass, ceramic, or a crystal material (e.g., quartz crystal).

In FIG. 6A, the inner main surface of the first cover board 10A includes a peripheral convexity 12 that faces the piezoelectric vibrating board 20. The convexity 12 is formed, inboard of the circumferential edge of the inner main surface, by etching away regions of the inner main surface located inboard and outboard of the convexity, without substantially etching the convexity. An excitation electrode 30 is formed inboard of the convexity 12. An extraction electrode 32 extends from a corner of the excitation electrode 30 to a corresponding corner of the first cover board 10A. The excitation electrode 30 and extraction electrode 32 comprise a gold (Au) layer formed on a chromium (Cr) layer. A continuous bead of electrically conductive adhesive 23 is applied in the peripheral region extending from the outer edge of the convexity 12 to the peripheral edge of the first cover board 10A. Respective notches Y are formed on the four corners of the first cover board 10A. Also, conductive wiring 31 is provided, as shown in FIG. 6D, that is electrically connected to the extraction electrode 32 via the adhesive 23.

In FIG. 6B, the piezoelectric vibrating board 20 is made of an AT-cut crystal vibrating piece. A respective notch Y is formed at each of the four corners of the piezoelectric vibrating board 20, wherein conduction wiring 31 has been formed. The piezoelectric vibrating board 20 includes a centrally located vibrating portion SB that exhibits, when energized, a thickness-shear vibration mode. The piezoelectric vibrating board 20 also includes a supporting frame portion SW that surrounds and supports the piezoelectric vibrating board 20 relative to the cover boards and that supports the vibrating portion SB.

In FIG. 6C, the inner main surface of the second cover board 40A defines a peripheral convexity 42 that faces the piezoelectric vibrating board 20. The convexity 42 is formed, inboard of the circumferential edge of the inner main surface, by etching away regions of the inner main surface located inboard and outboard of the convexity, without substantially etching the convexity. An excitation electrode 30 is formed inboard of the convexity 12. An extraction electrode 32 extends from a corner of the excitation electrode 30 to a corresponding corner of the second cover board 40A. The excitation electrode 30 and extraction electrode 32 comprise a gold (Au) layer formed on a chromium (Cr) layer. A continuous bead of electrically conductive adhesive 23 is applied in the peripheral region extending from the outer edge of the convexity 42 to the peripheral edge of the second cover board 40A. Respective notches Y are formed on the four corners of the second cover board 40A. Also, conductive wiring 31 is provided, as shown in FIG. 6D, that is electrically connected to the extraction electrode 32 via the adhesive 23.

Formed on the lower main surface of the second cover board 40A are a first external electrode 47 and a second external electrode 49, both being metalized. The external electrodes 47, 49 are electrically connected to the conduction wiring 31 formed in the respective notches Y.

As shown in FIG. 6D, the piezoelectric device 110 is formed by sandwiching the piezoelectric vibrating board 20 between the first cover board 10A and the second cover board 40A and bonding these boards together as a sandwich. On the cover boards 10A and 40A, the adhesive 23 is applied as a continuous bead outboard of the respective convexities 12 and 42. The bead of adhesive 23 is higher (not shown) than the height of the respective convexity 12, 42, and flattened as it is being heated and compressed. The adhesive is thermally cured, upon which the piezoelectric device 110 (comprising piezoelectric vibrating board 20 and cover boards 10A, 40A) is formed. As stated in Step S156 of FIG. 3A, the edge surfaces of the adhesive 23 are on the same surfaces as the edge surfaces of the piezoelectric vibrating board 20, the first cover board 10A, and the second cover board 40A via the through-holes 35 (which upon dicing become the respective notches Y in the four corners of the piezoelectric device 110). Thus, as in steps S159~S162, conduction wiring 31 is formed on the edge surfaces of the adhesive 23.

Since the adhesive 23 in this embodiment 110 is applied outboard of the convexities 12, 42, any gas discharged from the adhesive 23 over time can be prevented from adhering to the excitation electrodes 30. As a result, the piezoelectric devices 110 exhibit substantially improved operational stability over time.

Third Embodiment of Piezoelectric Vibrating Device

Figure 7A:
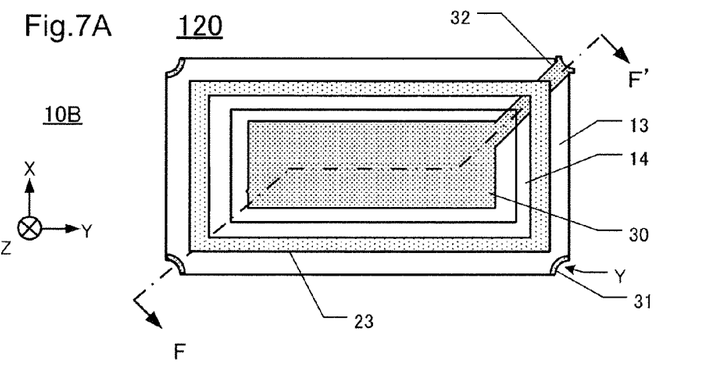
FIG. 7A is a plan view of the first cover board, as viewed from the piezoelectric vibrating substrate, of a third embodiment of a piezoelectric vibrating device.
Figure 7B:
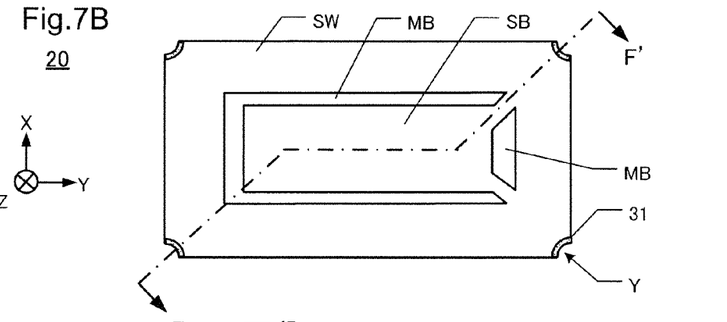
FIG. 7B is a plan view of the piezoelectric vibrating substrate of the third embodiment.
Figure 7C:
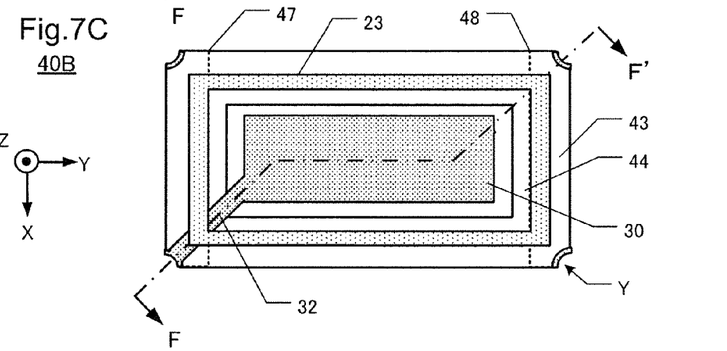
FIG. 7C is a plan view of the second cover board of the third embodiment.
Figure 7D:
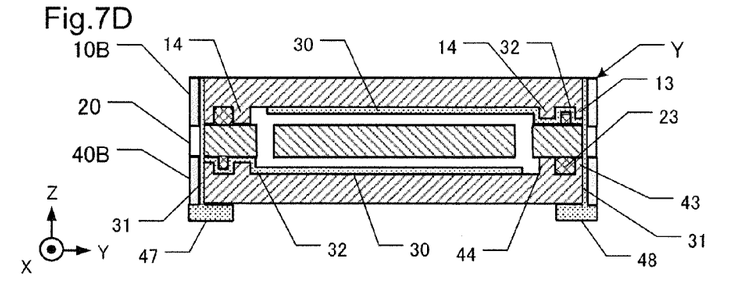
FIG. 7D is a cross-sectional view of the third embodiment of a piezoelectric vibrating device, along the line F-F' in FIGS. 7A, 7B, and 7C.

This embodiment 120 is shown in FIGS. 7A-7D, which are respective schematic views. FIG. 7A is a plan view of a first cover board 10B as viewed from the piezoelectric vibrating board. FIG. 7B is a plan view of the piezoelectric vibrating board 20. FIG. 7C is a plan view of the second cover board 40B. FIG. 7D is a cross-sectional view of the piezoelectric device 120 along the line F-F' of FIGS. 7A, 7B, and 7C. This embodiment 120 comprises the piezoelectric vibrating board 20, the first cover board 10B, and the second cover board 40B. The first and second cover boards 10B, 40B are made of glass, ceramic, or a crystal material (e.g., quartz crystal).

As shown in FIG. 7A, the first cover board 10B has a first convexity 13 and a second convexity 14 facing the piezoelectric vibrating board 20. The convexities 13, 14 are made by etching regions other than them, and have equal heights in the Z-direction. The first convexity 13 is just inboard of the peripheral edge of the first cover board 10B, and the second convexity 14 is inboard of the first convexity 13. The excitation electrode 30 is located inboard of the second convexity 14. An extraction electrode 32 extends from one corner of the excitation electrode 30 to a corresponding corner of the first cover board 10B. The excitation electrode 30 and the extraction electrode 32 comprise a gold (Au) layer formed on a chromium (Cr) layer. Adhesive 23 is applied as a continuous bead between the first convexity 13 and the second convexity 14 so as to surround the excitation electrode 30. Respective notches Y are situated on the four corners of the first cover board 10B. Conduction wiring 31 is located on the notches Y, and the conduction wiring 31.

Turning to FIG. 7B, the piezoelectric vibrating board 20 is made of AT-cut quartz crystal. The piezoelectric vibrating board 20 comprises a vibrating portion SB of which a center region exhibits thickness-shear vibration when appropriately energized. The piezoelectric vibrating board 20 also comprises a supporting frame portion SW that surrounds and supports the vibrating portion SB.

In FIG. 7C, the second cover board 40B has a third convexity 43 and a fourth convexity 44, both facing the piezoelectric vibrating board 20. The convexities 43, 44 are made by etching regions other than them, and have equal heights in the Z-direction. The third convexity 43 is just inboard of the peripheral edge of the second cover board 40B, and the fourth convexity 44 is inboard of the third convexity 43. The excitation electrode 30 is located inboard of the fourth convexity 44. An extraction electrode 32 extends from one corner of the excitation electrode 30 to a corresponding corner of the second cover board 40B. The excitation electrode 32 and the extraction electrode 32 comprise a gold (Au) layer formed on a chromium (Cr) layer. Adhesive 23 is applied as a continuous bead between the third convexity 43 and the fourth convexity 44 so as to surround the excitation electrode 30. Respective notches Y are situated on the four corners of the second cover board 40A. First and second external electrodes 47, 48 (both metalized) are located on the lower main surface of the second cover board 40B. The external electrodes 47, 48 are electrically connected to the conduction wiring 31 on an adjacent notch Y.

In FIG. 7D, the piezoelectric device 120 is configured such that the piezoelectric vibrating board 20 is sandwiched between the first cover board 10B and the second cover board 40B. The cover boards 10B, 40B are bonded to the upper and lower main surface, respectively, of the piezoelectric vibrating board 20. The adhesive 23 is applied between the first and second convexities 13, 14 of the first cover board 10 so as to extend around the peripheral regions of the first cover board 10B. The adhesive 23 is also applied between the first and second convexities 43, 44 of the second cover board 40 so as to extend around the peripheral regions of the second cover board 40B. As applied, the bead of adhesive 23 is higher (in the Z-direction) than any of the convexities 13, 14, 43, 44. Consequently, the adhesive 23 is flattened while being compressed. The adhesive 23 is thermally cured to bond together the piezoelectric vibrating board 20, first cover board 10B, and second cover board 40B of the piezoelectric device 120.

Since the adhesive 23 in this embodiment 120 is applied outboard of the second convexities 14, 44, any gas discharged over time from the adhesive 23 does not adhere to the excitation electrodes 30.

Fourth Embodiment of Piezoelectric Device

FIGS. 8A-8D schematically depict the fourth embodiment of a piezoelectric device 130 that is energized by space voltage impression (induction). A difference of this embodiment from the first embodiment 100 is that a respective first convexity 25 of the fourth embodiment is formed on both surfaces of the piezoelectric vibrating board 20C. The height of the first convexity 25 can be different from or equal to the height of corresponding convexities 15, 45 on the first and second cover boards 10C, 40C, respectively. In this embodiment as depicted, the convexity 25 has the same height as the convexities 15, 45.

Figure 8A:
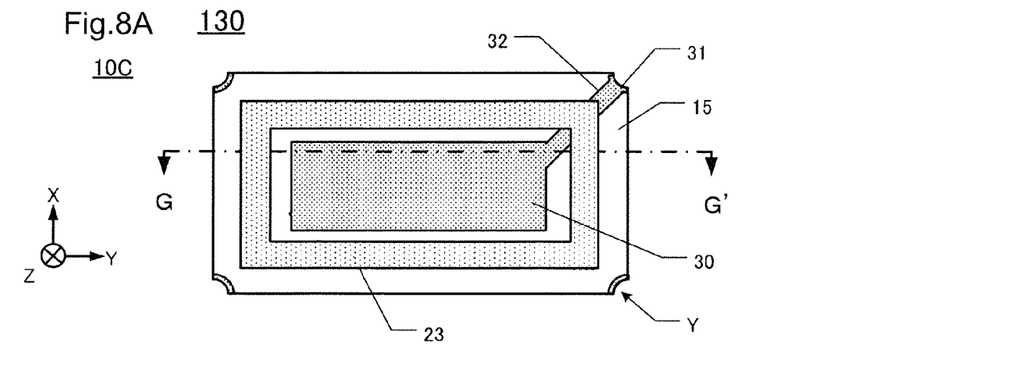
FIG. 8A is a plan view of the first cover board, as viewed from the piezoelectric vibrating substrate, of a fourth embodiment of a piezoelectric vibrating device.
Figure 8B:
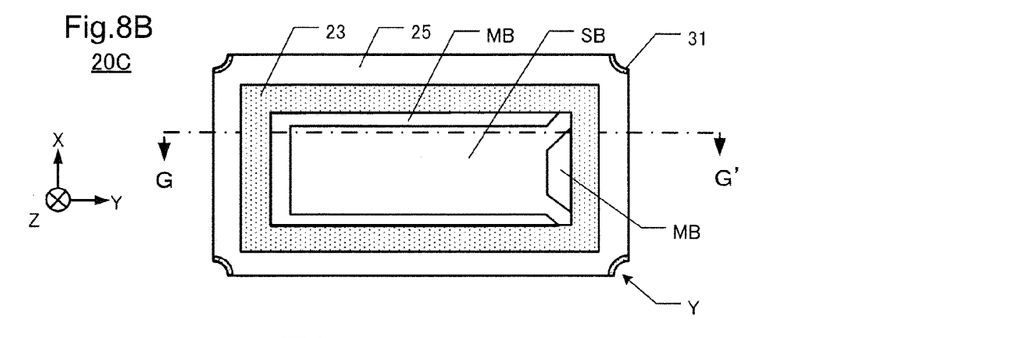
FIG. 8B is a plan view of the piezoelectric vibrating substrate of the fourth embodiment.
Figure 8C:
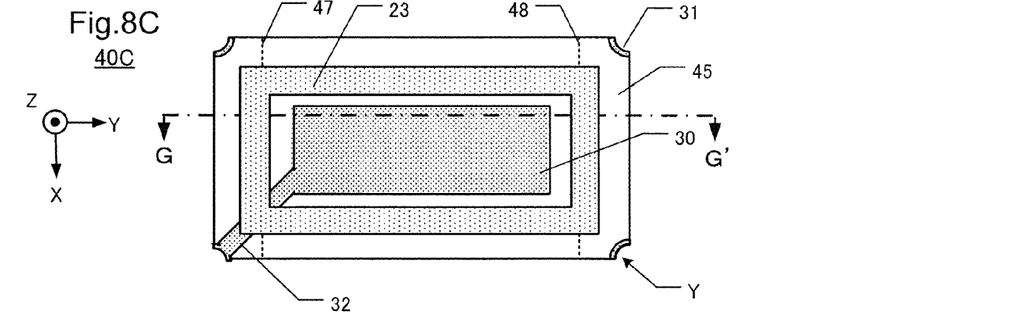
FIG. 8C is a plan view of the second cover board of the fourth embodiment.
Figure 8D:
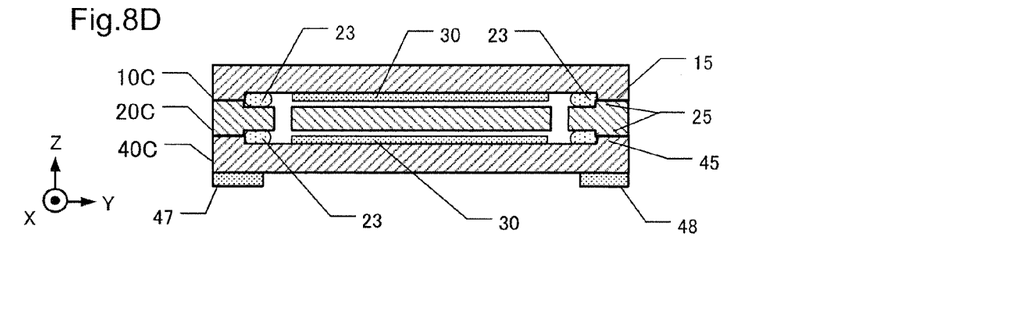
FIG. 8D is a cross-sectional view of the fourth embodiment of a piezoelectric vibrating device, along the line G-G' in FIGS. 8A, 8B, and 8C.

FIG. 8A is a plan view of the first cover board 10C as viewed from the piezoelectric vibrating board 20C. FIG. 8B is a plan view of the piezoelectric vibrating board 20. FIG. 8C is a plan view of the second cover board 40C. FIG. 8D is a cross-sectional view of the piezoelectric device 130 along the line G-G' in FIGS. 8A, 8B, and 8C. This embodiment 130 comprises the piezoelectric vibrating board 20C sandwiched between the first cover board 10C, and the second cover board 40C. The first and second cover boards 10C, 40C are made of a ceramic or crystal material (e.g., quartz crystal).

As shown in FIG. 8A, the first cover board 10C has a convexity 15 that faces the piezoelectric vibrating board 20C. The convexity 15 is situated just inboard of the peripheral edge of the first cover board 10C, and is formed by etching. An excitation electrode 30 is situated inboard of and surrounded by the first convexity 15. The extraction electrode 32 extends from a corner of the excitation electrode 30 to a corresponding corner of the first cover board 10C. The excitation electrode 30 and extraction electrode 32 are each a gold (Au) layer formed on a chromium (Cr) layer. A continuous bead of adhesive 23 is applied inboard of the convexity 15 so as to surround the convexity. A respective notch Y is situated at each of the four corners of the first cover board 10C, on which conduction wiring 31 is formed. The conduction wiring 31 is electrically connected to the extraction electrode 32.

Turning to FIG. 8B, the piezoelectric vibrating board 20C comprises a convexity 25 located just inboard of the peripheral edge of the board. The convexity, formed on both main surfaces by etching, has the same height (Z-direction) as the convexities 15, 45. A continuous bead of adhesive 23 is applied just inboard of the convexity 25 so as to surround the central region of each main surface of the piezoelectric vibrating board 20C. Located in the center of the board 20c is a vibrating portion SB that exhibits a thickness-shear vibration mode when energized.

In FIG. 8C the second cover board 40C includes a convexity 45 facing the piezoelectric vibrating board 20C. The convexity 45 is located just inboard of the peripheral edge of the second cover board 40C, and is formed by etching. An excitation electrode 30 is situated inboard of the convexity 45, substantially in the middle thereof. The excitation electrode 30 and extraction electrode 32 each comprise a gold (Au) layer on a chromium (Cr) layer. The adhesive 23 is applied as a continuous bead in a region just inboard of the convexity 45 so as to surround the excitation electrode 30. A respective notch Y is situated at each of the four corners of the first cover board 10C, on which conduction wiring 31 is formed.

Metalized first and second external electrodes 47, 48 are situated on the lower main surface of the second cover board 40C. The external electrodes 47, 48 are electrically connected to respective conduction wirings 31 on respective notches Y.

In FIG. 8D, this fourth embodiment of a piezoelectric vibrating device 130 is assembled by sandwiching the piezoelectric vibrating board 20C between the first cover board 10C and the second cover board 40C and bonding the first and second cover boards to the upper and lower main surfaces, respectively, of the vibrating board 20C. A continuous bead of adhesive 23 is applied between the convexities 15 and 25 and between the convexities 25, 45. The height (Z-direction) of the adhesive 23 as applied is greater than the combined heights of the convexities 15 and 25, and greater than the combined heights of the convexities 45 and 25. The adhesive 23 is thermally cured as compression is applied to bond together the piezoelectric vibrating board 20C to the cover boards 10C and 40C, thereby producing a piezoelectric device 140 according to this embodiment.

Although not shown, similar to the third embodiment 120, in the fourth embodiment 130, the convexity 25 can be formed on the piezoelectric vibrating board 20 of the second embodiment 110 or on the piezoelectric vibrating board 20 of the third embodiment 120.

Fifth Embodiment of Piezoelectric Vibrating Device

A piezoelectric device 140 according to this embodiment is schematically depicted in FIGS. 9A-9D. The device 140 is energized by space voltage impression (induction). The fifth piezoelectric device 140 is a variation of the first embodiment 100, with the following difference. In this fifth embodiment the first cover board 10D does not have a convexity; rather, the inner main surface of the cover board 10D is planar. Meanwhile, a first convexity 21 is formed on the upper main surface (facing the first cover board 10D) of the piezoelectric vibrating board 20D, and the excitation electrode 30 and the extraction electrode 32 are formed inboard of the first convexity 21. Hence, a space electrode is not formed on the inner main surface of the first cover board 10D; rather an excitation electrode is formed on the upper main surface of the piezoelectric vibrating board 20D. Hereinbelow, only those features of the fifth embodiment that are different from the first embodiment 100 are described.

Figure 9A:
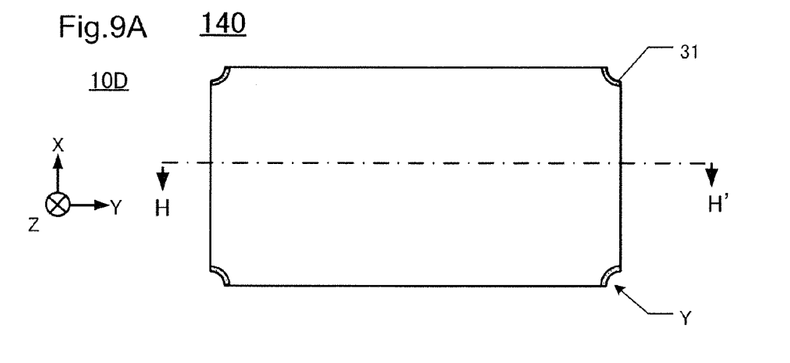
FIG. 9A is a plan view of the first cover board, as viewed from the piezoelectric vibrating substrate, of a fifth embodiment of a piezoelectric vibrating device.
Figure 9B:
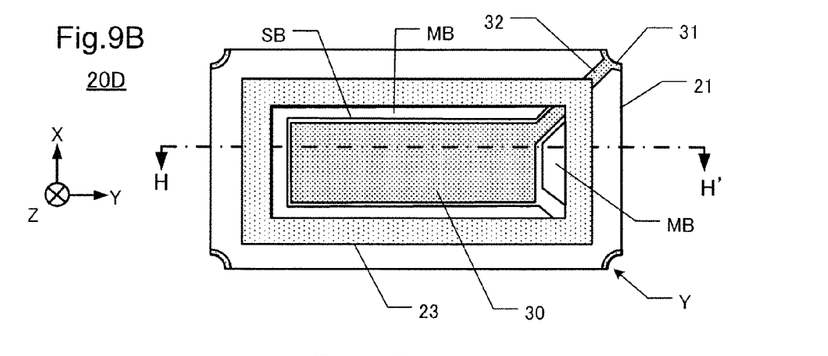
FIG. 9B is a plan view of the piezoelectric vibrating substrate of the fifth embodiment.
Figure 9C:
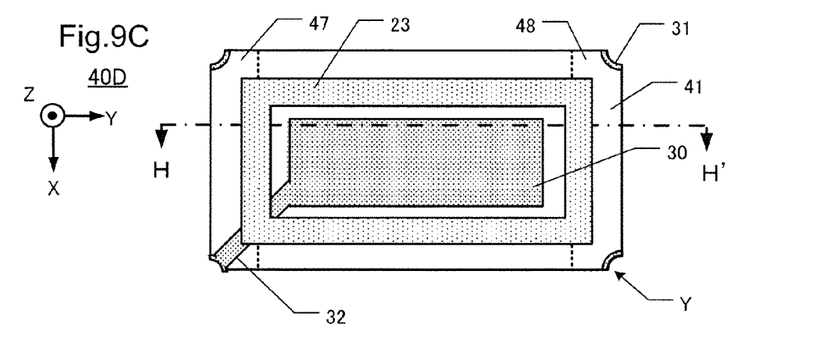
FIG. 9C is a plan view of the second cover board of the fifth embodiment.
Figure 9D:
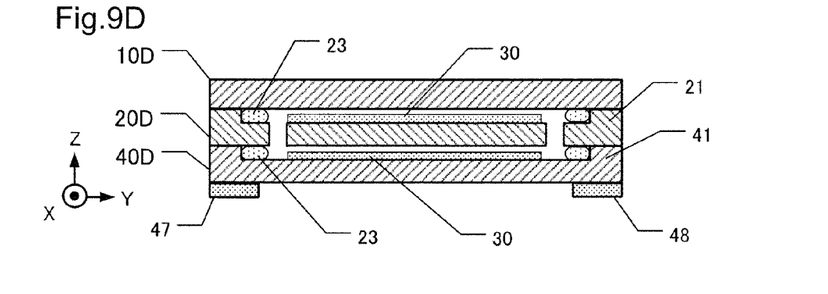
FIG. 9D is a cross-sectional view of the fifth embodiment of a piezoelectric vibrating device, along the line H-H' in FIGS. 9A, 9B, and 9C.

FIG. 9A is a plan view of the first cover board 10D as viewed from the piezoelectric vibrating board 20D. FIG. 9B is a plan view of the piezoelectric vibrating board 20. FIG. 9C is a plan view of the second cover board 40D. FIG. 9D is a cross-sectional view of this embodiment of a piezoelectric device 140, along the line H-H' in FIGS. 9A, 9B, and 9C. The piezoelectric device 140 comprises the piezoelectric vibrating board 20D, the first cover board 10D, and the second cover board 40D.

As shown in FIG. 9A, the first cover board 10D is a planar board, with a respective notch Y formed at each of the four corners. In the first through fourth embodiments the notches on the first cover board included respective conduction wiring 31. In the fifth embodiment 140, conduction wiring 31 is not necessary on the notches of the first cover board 10D.

Turning now to FIG. 9B, the piezoelectric vibrating board 20D comprises a crystal vibrating piece. A convexity 21 on the vibrating board 20D faces the first cover board 10D. The convexity 21 is formed by etching and is located just inboard of the peripheral edge of the piezoelectric vibrating board 20D. The convexity 21 surrounds an excitation electrode 30 situated on the vibrating portion SB. An extraction electrode 32 extends from a corner of the excitation electrode 30 to a corresponding corner of the first cover board 10C. A continuous bead of adhesive 23 is applied inboard of the convexity 21 so as to surround the vibrating portion SB. A respective notch Y is situated at each corner of the piezoelectric vibrating board 20D. Conduction wiring 31 is formed on respective notches Y.

In FIG. 9C, the second cover board 40D includes a respective convexity 41, excitation electrode 30, and extraction electrode 32. A continuous bead of adhesive 23 is applied to the second cover board 40D inboard of the convexity 41. A respective notch Y is located at each corner of the second cover board 40, and conduction wiring 31 is on respective notches Y.

The piezoelectric device 140 of this embodiment includes first and second external electrodes 47, 48, respectively. The second cover board 40D has the same configuration as the second cover board 40 of the first embodiment 100.

As shown in FIG. 9D, the fifth embodiment 140 is assembled by forming a sandwich of the piezoelectric vibrating board 20D between and aligned with the first and second cover boards 10D, 40D. A continuous bead of adhesive 23 is applied just inboard of the convexity 21 on the vibrating board 20D and just inboard of the convexity 41 of the second cover board 40D. The height (Z-direction) of each bead of adhesive 23 is higher than of the convexities 21 and 41, respectively. The adhesive 23 is flattened as it is being compressed and heated. Thus, the piezoelectric vibrating board 20D, the first cover board 10D and the second cover board 40D are bonded together to produce the fifth embodiment of a piezoelectric device 140.

If an excitation electrode is formed on the crystal vibrating piece, stress is generated between the excitation electrode and the crystal vibrating piece. This stress produces strain that worsens the aging characteristics of the piezoelectric device. Further, this stress also generates heat, which causes changes in the vibration frequency of the device. A space electrode reduces or eliminates the stress between the excitation electrode and the crystal vibrating piece, which improves the aging characteristics and suppresses changes in vibration frequency.

However, a space electrode requires a gap between it and the crystal vibrating piece. This gap is wider than any space required in devices not using space electrodes. The wider gap tends to increase the CI value of the device. In the fifth embodiment of a piezoelectric device 140, by utilizing a space electrode opposite only one surface of the vibrating portion, increases in the CI value can be suppressed better, compared to devices utilizing space electrodes opposite both surfaces. Also, aging and frequency changes can be suppressed better, compared to devices utilizing respective excitation electrodes on both main surfaces of the crystal vibrating piece.

Although not specifically illustrated, in the second embodiment 110 and third embodiment 120 of a piezoelectric device (and similar to the fifth embodiment 140), the convexity 21 can be formed on the first main surface of the piezoelectric vibrating board 20 and the excitation electrode 30 and the extraction electrode 32 can be formed inboard of the convexity 21.

The invention has been described above in the context of preferred embodiments. It will be obvious to persons of ordinary skill in the relevant art to modify the invention based on this disclosure.

For example, the piezoelectric vibrating board 20D of the fifth embodiment 140 can be flipped over and the second cover board 40D be configured as the planar cover board. Also, the excitation electrode 30 can be formed on the piezoelectric vibrating board 20D (configured as a planar board) by forming the convexity 11 on and applying the adhesive 23 to the first cover board 10D. Also, although the crystal vibrating pieces were described as AT-cut, a BT-cut crystal vibrating piece alternatively can be used to achieve the same result. Also, even though a crystal material is used in these embodiments as the piezoelectric material, it will be understood that crystal material is one example of various materials that can be used. Alternatively, $LiTaO_3$ (lithium tantalate) can be used as a piezoelectric material. Moreover, any of the piezoelectric devices disclosed herein can be configured as respective piezoelectric oscillators, which are essentially piezoelectric devices that include an integrated circuit (IC) including an oscillation circuit.

What is claimed is:

1. A piezoelectric device, comprising:
a piezoelectric vibrating board including a first main surface, a second main surface, a vibrating portion, and a frame portion, the vibrating portion exhibiting a thickness-shear vibration mode and being coupled to the frame portion, the frame portion comprising first and second main surfaces and extending around the vibrating portion;

a first cover board coupled to the piezoelectric vibrating board, the first cover board having inner and outer main surfaces, the inner main surface including a first excitation electrode aligned with but separated from the vibrating portion so as to serve as a space electrode that stimulates vibration of the vibrating portion;

a second cover board bonded to the second main surface of the piezoelectric vibrating board such that the piezoelectric vibrating board is sandwiched between the first and second cover boards to define a package in which the vibrating portion is supported and hermetically sealed from the external environment by the cover boards and frame portion, the second cover board having inner and outer main surfaces;

at least one external electrode situated on an outer main surface of either of the cover boards;

a second convexity defined on either the first main surface of the frame portion or the inner main surface of the first cover board, the second convexity surrounding the first excitation electrode and being located inboard of a circumferential edge of the respective board, the second convexity having a height establishing a predetermined gap by which the first excitation electrode is separated from the vibrating portion;

a first convexity defined on the same main surface as the second convexity, the first convexity surrounding the first excitation electrode and being located outboard of the second convexity, the first and second convexities having substantially equal height; and an application of adhesive forming a bond of the inner main surface of the first cover board to the first main surface of the piezoelectric vibrating board, the application being between the first and second convexities, but not on the second convexity, and extending continuously around the vibrating portion.

2. The piezoelectric device of claim 1, further comprising:

a second excitation electrode situated on the inner main surface of the second cover board, the second excitation electrode being aligned with but separated from the vibrating portion so as to serve, cooperatively with the first excitation electrode, as a space electrode that stimulates vibration of the vibrating portion;

a fourth convexity defined on either the second main surface of the frame portion or the inner main surface of the second cover board, the fourth convexity surrounding the second excitation electrode and being located inboard of a circumferential edge of the respective board, the fourth convexity having a height establishing a predetermined gap by which the second excitation electrode is separated from the vibrating portion; and a further application of adhesive forming a bond of the inner main surface of the second cover board to the second main surface of the frame portion, the application being adjacent the fourth convexity, but not on the fourth convexity, and extending continuously around the vibrating portion.

3. The piezoelectric device of claim 2, further comprising:

a third convexity defined on the same main surface as the fourth convexity, the third convexity surrounding the second excitation electrode and being located outboard of the fourth convexity, the third and fourth convexities having substantially equal height;

wherein the application of adhesive forming a bond of the inner main surface of the second cover board to the second main surface of the frame portion is between the third and fourth convexities.

* * * * *